United States Patent
Banhegyesi

(10) Patent No.: US 7,996,171 B2
(45) Date of Patent: Aug. 9, 2011

(54) INTELLIGENT ELECTRONIC DEVICE WITH BROAD-RANGE HIGH ACCURACY

(75) Inventor: Tibor Banhegyesi, Baldwin, NY (US)

(73) Assignee: Electro Industries/Gauge Tech, Westbury, NY (US)

(*) Notice: Subject to any disclaimer, the term of this patent is extended or adjusted under 35 U.S.C. 154(b) by 352 days.

(21) Appl. No.: 12/055,448

(22) Filed: Mar. 26, 2008

(65) Prior Publication Data
US 2008/0172192 A1 Jul. 17, 2008

Related U.S. Application Data

(60) Provisional application No. 60/920,128, filed on Mar. 27, 2007.

(51) Int. Cl.
*G12B 13/00* (2006.01)
*G06F 19/00* (2006.01)
*G06F 17/40* (2006.01)

(52) U.S. Cl. ....... 702/85; 73/1.01; 73/865.9; 324/76.11; 702/187; 702/189

(58) Field of Classification Search ............ 73/1.01, 73/865.8, 865.9; 324/76.11, 103 R, 156, 324/140 D, 140 R, 141, 142, 500, 537, 115; 327/100, 306; 702/1, 57, 60, 61, 62, 64, 702/65, 85, 88, 104, 107, 127, 187, 189; 708/100, 200, 208, 209
See application file for complete search history.

(56) References Cited

U.S. PATENT DOCUMENTS

| | | | | |
|---|---|---|---|---|
| 3,333,194 A | * | 7/1967 | Batcher | 324/772 |
| 3,535,637 A | * | 10/1970 | Nils | 324/130 |
| 3,824,441 A | | 7/1974 | Heyman et al. | |
| 4,689,752 A | * | 8/1987 | Fernandes et al. | 700/292 |
| 4,884,021 A | * | 11/1989 | Hammond et al. | 324/142 |
| 4,996,646 A | | 2/1991 | Farrington | |
| 5,166,887 A | | 11/1992 | Farrington et al. | |
| 5,170,360 A | | 12/1992 | Porter et al. | |
| 6,018,690 A | | 1/2000 | Saito et al. | |
| 6,032,109 A | * | 2/2000 | Ritmiller, III | 702/104 |
| 6,098,175 A | | 8/2000 | Lee | |
| 6,167,329 A | | 12/2000 | Engel et al. | |
| 6,528,957 B1 | | 3/2003 | Luchaco | |
| 6,735,535 B1 | * | 5/2004 | Kagan et al. | 702/61 |
| 7,337,081 B1 | * | 2/2008 | Kagan | 702/60 |
| 2003/0187550 A1 | | 10/2003 | Wilson et al. | |
| 2005/0165585 A1 | * | 7/2005 | Bhateja et al. | 702/188 |
| 2008/0147334 A1 | * | 6/2008 | Kagan | 702/60 |
| 2008/0234957 A1 | * | 9/2008 | Banhegyesi et al. | 702/64 |
| 2009/0228224 A1 | * | 9/2009 | Spanier et al. | 702/60 |

FOREIGN PATENT DOCUMENTS
JP 08-247783 A * 9/1996
* cited by examiner

*Primary Examiner* — Edward R Cosimano
(74) *Attorney, Agent, or Firm* — Gerald E. Hespos; Michael J. Porco

(57) ABSTRACT

A method and apparatus provides high-accuracy measurements of an electrical parameter across a broad range of parameter input values. In one embodiment, an intelligent electronic device (IED), e.g., a digital electrical power and energy meter, with a plurality of independently-adjustable gain factors measures a parameter, and calculates and stores calibration factors associated with known values of the measured parameter. The IED or meter applies the stored calibration factors when measuring unknown values of the measured parameter, to improve the accuracy of the measurement.

22 Claims, 9 Drawing Sheets

| REFERENCE VALUE | MEASURED VALUE | CALIBRATION FACTOR | PRE-CALIBRATION ERROR | POST-CALIBRATION ERROR |
|---|---|---|---|---|
| 20.00 V | 18.76 V | 1.066 | 6.200% | 0.009% |
| 40.00 V | 38.42 V | 1.041 | 3.950% | 0.012% |
| 60.00 V | 58.17 V | 1.031 | 3.050% | 0.045% |
| ... | ... | ... | ... | ... |
| 460.00 V | 453.29 V | 1.015 | 1.459% | -0.019% |
| 480.00 V | 473.38 V | 1.014 | 1.379% | -0.002% |
| 500.00 V | 493.46 V | 1.013 | 1.308% | 0.025% |

*FIG. 7A*

| REFERENCE VALUE | MEASURED VALUE | CALIBRATION FACTOR | PRE-CALIBRATION ERROR | POST-CALIBRATION ERROR |
|---|---|---|---|---|
| 18.76 V | 20.00 V | 0.938 | 6.610% | 0.000% |
| 38.42 V | 40.00 V | 0.961 | 4.112% | 0.052% |
| 58.17 V | 60.00 V | 0.970 | 3.146% | 0.052% |
| ... | ... | ... | ... | ... |
| 453.29 V | 460.00 V | 0.985 | 1.480% | -0.042% |
| 473.38 V | 480.00 V | 0.986 | 1.398% | -0.021% |
| 493.46 V | 500.00 V | 0.987 | 1.325% | 0.008% |

INTELLIGENT ELECTRONIC DEVICE WITH BROAD-RANGE HIGH ACCURACY

CROSS-REFERENCE TO RELATED PATENT APPLICATIONS

This application also claims priority to U.S. Provisional Patent Application No. 60/920,198, filed on Mar. 27, 2007, which is herein incorporated by reference.

FIELD

This patent relates generally to the field of intelligent electronic devices for electrical utility services and, more specifically, to digital electrical power and energy meters for the electrical utility services.

BACKGROUND

Producers, suppliers, and consumers of electrical power rely on energy meters to monitor power consumption and quality for numerous purposes, including billing and revenue calculations, power distribution management, and process management. Traditionally, the primary means of measuring power consumption was an electro-mechanical power meter. A number of other types of meters and equipment measured other parameters of power generation, distribution, usage, and quality. As technology has improved, intelligent electronic devices (IEDs), such as digital power and energy meters, Programmable Logic Controllers (PLCs), electronically-controlled Remote Terminal Units (RTUs), protective relays, fault recorders, and the like, have slowly replaced their electro-mechanical and analog counterparts. The shift to IEDs from analog and electro-mechanical devices provides a vast array of advantages, including improvements in measurement accuracy (e.g., voltage, current, power consumption, power quality, etc.) and system control (e.g., allowing a meter to trip a relay or circuit breaker).

The voltages, currents, and frequencies employed in the various electrical systems that utilize IEDs vary widely from region to region (e.g., the United States and Europe), from application to application (e.g., industrial or residential), and across various parts of a power distribution system (e.g., generation, transmission, delivery, etc.). For example, power may be generated at one voltage (e.g., 30,000 V), but transmitted at another, much higher voltage (e.g., 10,000 V), to minimize heat-related power losses related to large electrical current in the transmission lines. Additionally, a series of power sub-stations transforms the voltages employed for transmitting power, to bring the voltage down to the level at which it is distributed to customers (e.g., 220 V). Industrial power consumers in one region may receive power at one voltage (e.g., 480 V), while residential consumers in the same region receive power at a second voltage (e.g., 120 V). Residential consumers in one region may receive power at one voltage and frequency (e.g., 120 V at 60 Hz in the United States) while similar consumers in another region may receive power at a different voltage and frequency (e.g., 230 V at 50 Hz in Europe).

Power measurements typically occur at a few industry-standard voltages and frequencies. Higher operating voltages and currents are reduced to a few standard current ranges, so that the higher operating voltages and currents can be measured by meters designed to measure within those voltage and current ranges (e.g., 120 V, 208 V, 220 V, 277 V, 347 V, and 690 V). However, the disparity in the voltages, currents, and frequencies employed, not withstanding the relatively few standard ranges in which measurements are taken, generally necessitates that different IEDs be purchased for different input ranges, in order to comply with the various standards which the IEDs must meet. For example, a digital power and energy meter designed to measure power consumption and quality at an industrial facility may be inoperable or inaccurate—failing to meet industry requirements for the particular application—if employed at a power generation facility.

Thus, to comply with the requirements for accuracy among the multiple standards adhered to across industries and geographical regions, manufacturers of IEDs commonly configure and sell multiple "options" for each model of meter, where each of the options includes a voltage and current level that the purchaser expects the meter to measure. The meters are thereafter calibrated to meet the required standards. For example, one standard requires that energy calculations be accurate to within 0.2%. While many meters are calibrated to achieve an error of no more than 0.2% for one range of input signal levels (e.g., 120 V or 69 V), measuring a different range of signal levels requires recalibration to achieve the desired accuracy. This requirement is often necessary because part-to-part variations in the meter design, and offsets and/or phase shifts in sensor and/or input networks, have varying effects at different signal levels.

SUMMARY OF THE DISCLOSURE

An intelligent electronic device (IED), e.g., a digital electrical power and energy meter, described herein is operable and highly accurate while conducting measurement activities at each of a number of different industry-standard voltage, current, and frequency ranges. Specifically, the meter includes a plurality of individually-adjustable gain-controlled channels, which selectively regulate the amplitudes of the signals communicated to various modules of the meter. The regulated signals, which are proportional to the sensed supply voltages and supply currents of the electrical service to which the meter is connected, may be adjusted to match pre-determined ranges for input signals of the various modules of the meter, so as to optimally utilize the dynamic range of the included analog-to-digital converters. In addition, the processing module of the meter may be designed to perform a series of voltage and/or current calibration measurements, using known voltage and current sources to determine a plurality of calibration factors for use while measuring and/or monitoring the electrical service. The meter utilizes these calibration factors to achieve optimal accuracy when measuring within each of the ranges of voltage and current in which the meter may operate. The calibration measurements may further include performing each series of calibration measurements at multiple frequencies, to achieve optimal accuracy regardless of the frequency range of the monitored signal.

BRIEF DESCRIPTION OF THE DRAWINGS

FIGS. 7A & 7B illustrate sample sets of calibration measurements and calibration factors corresponding to the methods of FIGS. 6A & 6B, respectively.

To facilitate understanding, identical reference numerals have been used, where possible, to designate identical elements that are common to the figures, except that suffixes may be added, when appropriate, to differentiate such elements.

The appended drawings illustrate exemplary embodiments of the present disclosure and, as such, should not be considered as limiting the scope of the disclosure that may admit to other equally effective embodiments. It is contemplated that features or steps of one embodiment may beneficially be incorporated in other embodiments without further recitation.

DETAILED DESCRIPTION

Figure 1:
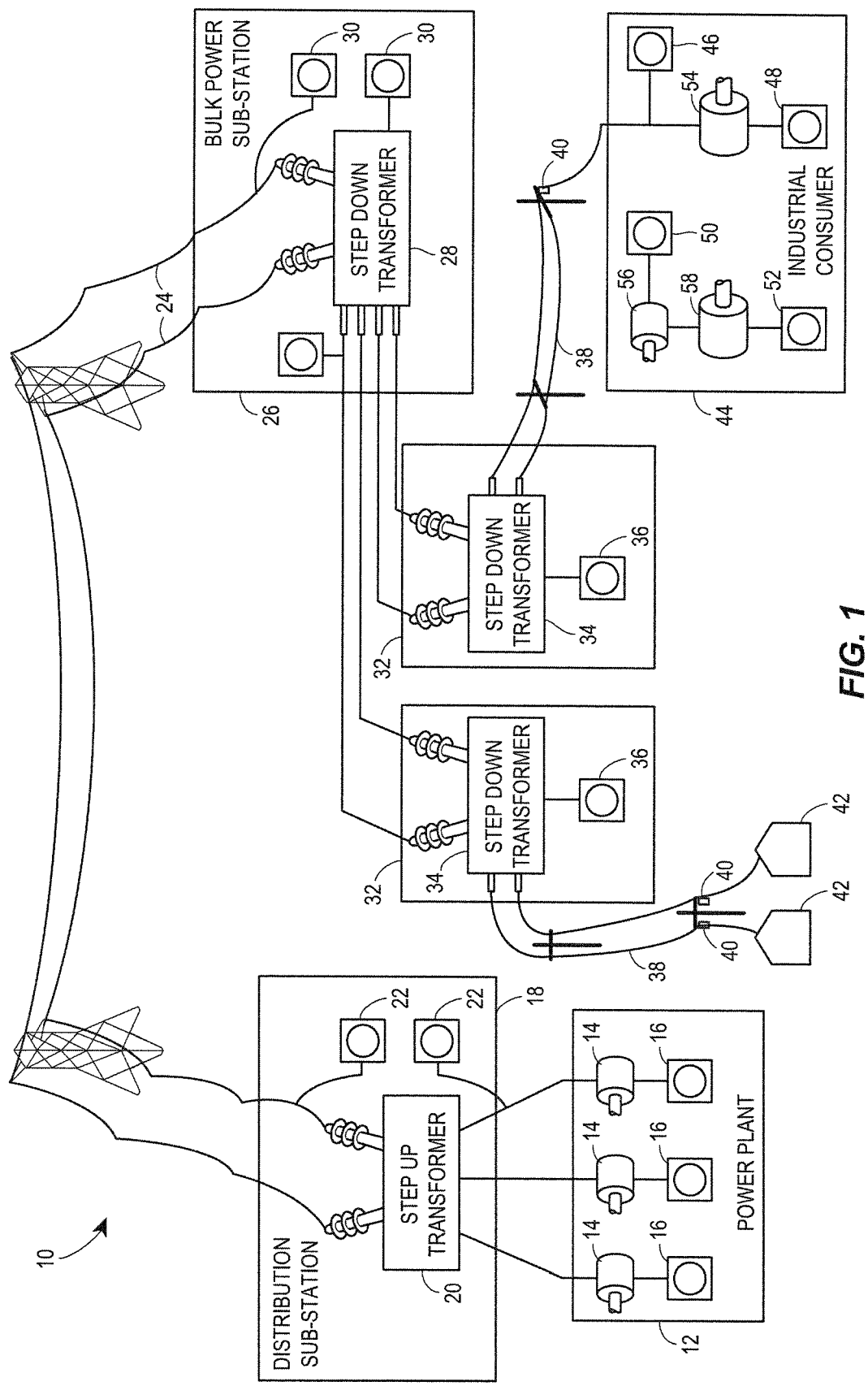
FIG. 1 depicts an exemplary electrical power distribution grid for transmitting electrical power from a power plant to a plurality of consumers and employing a plurality of digital electrical power and energy meters.

FIG. 1 depicts an electrical power distribution grid 10 including a number of electrical service environments which may employ digital electrical power and energy meters, such as those disclosed herein. A power plant 12 includes a plurality of generators 14 powered by steam, coal, natural gas, nuclear reactor, etc. Each of a plurality of digital electrical power and energy meters 16 monitors various parameters (e.g., voltage, current, frequency, power quality, etc.) of the output of the generators 14.

As illustrated in FIG. 1, the generators 14 transmit the generated energy from the power plant 12 to a distribution substation 18. At the distribution substation 18, one or more step-up transformers 20 transform the energy generated by the generators 14 from a relatively lower voltage (e.g., 10,000 V) generated by the generators 14 to a relatively higher voltage (e.g., 500,000 V) for transmission over long distances using high-voltage transmission lines 24. A plurality of digital electrical power and energy meters 22 may monitor the energy at either or both of the inputs and the outputs of the step-up transformers 20 to, for example, verify that proper voltages, frequencies, and phase relationships are maintained, and generally to monitor the overall health of the distribution grid 10.

A bulk power substation 26 receives the energy transmitted over the high-voltage transmission lines 24 from the distribution substation 18. One or more step-down transformers 28 in the bulk power substation 26 transform the energy received over the high-voltage transmission lines 24 from the transmission voltage to a relatively lower voltage (e.g., 100,000 V). The bulk power substation 26 also includes on or more buses (not shown) to allow the energy to be directed in different directions for transmission to multiple locations. Of course, the bulk power substation 26 may employ a plurality of digital electrical power and energy meters 30 to monitor the energy at the substation 26, just as the meters 16, 22 monitor energy at the power plant 12 and the distribution substation 18.

The bulk power substation 26 transmits the energy output from the step-down transformers 28 to one or more distribution substations 32. Each of the distribution substations 32 includes one or more step-down transformers 34 for further transforming the energy to a relatively lower voltage (e.g., 7,200 V) for distribution to consumers, and may also include a plurality of digital electrical power and energy meters 36 for further monitoring of power parameters. The distribution substations 32 transmit the energy via local power lines 38 to various distribution transformers 40. The distribution transformers 40 step-down the voltage once more to the distribution voltage (e.g., 240 V or 480 V). From the distribution transformers 40, the energy is transmitted to residential consumer facilities 42 (e.g., homes) and industrial consumers facilities 44 (e.g., factories).

Industrial consumer facilities 44, in particular, may employ a plurality of digital electrical power and energy meters 46, 48, 50, 52 throughout the industrial environment. For example, the meter 46 may monitor the energy coming from the utility, as a means of verifying that the utility is providing power of sufficient quality (i.e., relatively free of sags and swells, having low harmonic distortion, etc.) and not overcharging the industrial consumer for more power than the utility actually delivers. Of course, the utility may also monitor the energy and quality delivered, using the meter 46. The meter 48 may be used, for example, to monitor energy consumption by, and the quality of power delivered to, one or more loads 54 within the industrial consumer facility 44. Similarly, the meters 50 and 52 may monitor other parts of the industrial consumer facility, such as back-up generation capacity 56 (e.g., generators) and other loads 58 connected to the back-up generation capacity 56. In this manner, the electrical power and energy meters 16, 22, 30, 36, 46, 48, 50, and 52 may monitor energy creation, distribution, and consumption throughout the distribution grid.

Figure 2:
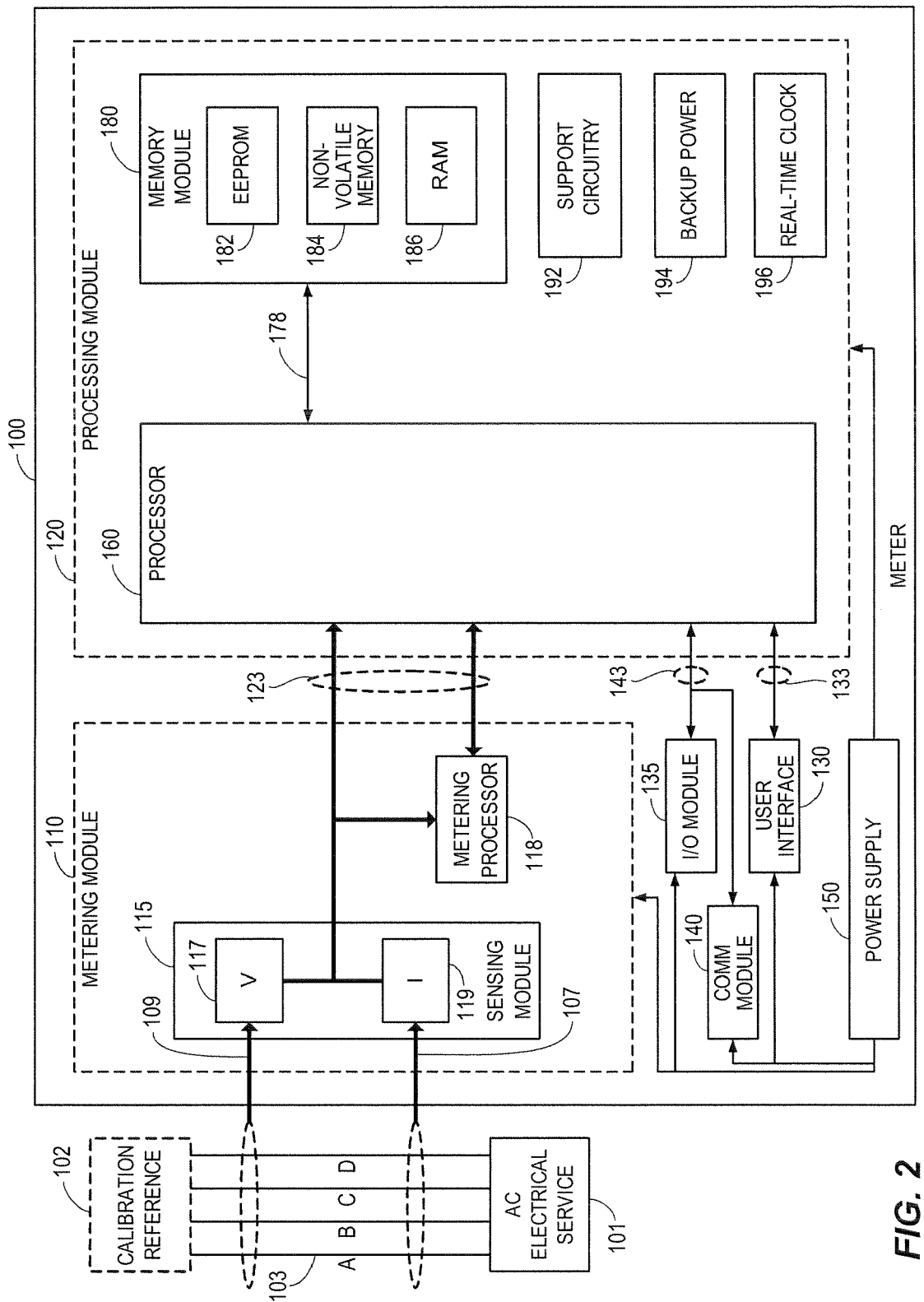
FIG. 2 is a block diagram illustrating an exemplary digital electrical power and energy meter.

FIG. 2 depicts a block diagram illustrating an exemplary digital electrical power and energy meter 100 which may be used to implement any of the electrical power and energy meters 16, 22, 30, 36, 46, 48, 50, and 52 of FIG. 1. The meter 100 generally comprises a metering module 110 for measuring or calculating one or more parameters associated with the electrical load or service (e.g., voltage, current, energy, etc.) and a processing module 120 for facilitating operation of the meter 100 and processing data obtained from the metering module 110. The meter 100 may also include a user interface unit 130 for displaying results of measurements and calculations and allowing configuration of the meter 100; one or more input/output (I/O) modules 135, for facilitating communication of data to an external device (not shown); a communications module 140 for coupling to one or more remote terminals (not shown); and a power supply 150 for providing power to the various components and modules of the meter 100. Said (I/O) modules include but are not limited to transducer outputs consisting of DC signals output by a digital to analog converter which are proportional to the desired measured parameters in exemplary ranges such as −1 to 0 to +1 mA outputs, 0 to 1 mA outputs, 4-20 mA outputs or others wherein the user generally can program the low scale and high scale parameter for the output. Other input/output modules include Ethernet, Profibus, Lon Works, telephone modem, wireless transceiver, cellular modem or phone, relay outputs, pulse outputs, analog inputs and status inputs, etc. Any one or more of these types of input/output modules are considered facilitating communication of data to an external network.

During normal operation, the metering module 110 may be coupled to an electrical service to be measured and/or monitored, such as the three-phase electrical service 101 of FIG. 2. A current interface 107 and a voltage interface 109 couple the meter 100 to supply lines 103 A, B, C, and N of the electrical service 101. Alternatively, when calibrating the meter 100, the current interface 107 and the voltage interface 109 may couple the metering module 110 to a calibration reference 102. Manufacturers typically perform meter calibration subsequent to assembly of the meter 100 and prior to shipping the meter 100 to the intended customer. Calibration may also be performed at periodic intervals thereafter over the lifetime of the meter 100. Each of the interfaces 107 and 109 may include a plurality of connections (indicated in FIG. 2 by the bold connecting arrows), e.g., connections to each of phases A, B, C, and N, in the depicted embodiment. U.S. patent application Ser. No. 11/003,064, now U.S. Pat. No. 7,271,996, details some methods of coupling digital electrical power and energy meters to various electrical services. The connections of the interfaces 107, 109 may be, for example, screw-type connections, blade-jaw connections, etc. Those of ordinary skill in the art will be familiar with other methods for coupling meters to electrical services, thus these methods need not be described further herein.

The metering module 110 may include a sensing module 115 for sensing the currents and voltages on the interfaces 107 and 109, respectively, and generating for each sensed current or voltage, a signal representative thereof. The sensing module 115 includes voltage sensing circuitry 117 connected to the voltage interface 109, and current sensing circuitry 119 connected to the current interface 107. In the depicted embodiment, the metering module 110 also includes a metering processor 118, for calculating one or more parameters of the electrical service 101. In particular, the metering processor 118 of the current embodiment may calculate energy usage.

An interface 123, which communicatively couples the metering module 110 to the processing module 120, may include one or more buses connecting, for example, the metering processor 118 and the sensing module 115 to the processing module 120. In one embodiment, the interface 123 includes two analog signal paths from the sensing module 115 to a processor 160, and digital data paths (e.g., address and data buses, a serial peripheral interface, etc.) between the metering processor 118 and the processor 160. The analog signal paths include additional analog channels for use by the processor 160, as described in detail below. Interfaces 133 and 143 communicatively couple the processing module 120 to the user interface module 130 and the communications and/or I/O modules 135 and 140, respectively. The interfaces 123, 133, 143 may be any type of physical interfaces, and may be any appropriate logical interfaces. For example, where each module resides on a separate printed circuit board (PCB), each physical interface may include a cable, a header/receptacle connector, a card-edge connector, or a stackable connector. Each logical interface may include a serial interface or serial peripheral interface (SPI), one or more parallel data/address buses, etc. Said interfaces could be using an electrical or optical means. Further, multiple modules may reside on a single PCB, allowing the modules to be connected via connections embedded in the PCB. Additionally, the modules need not be physically distinct from one another, nor need the modules be physically segregated.

In the embodiment depicted in FIG. 2, the processing module 120, which may be disposed on one PCB or on multiple PCBs, includes the processor 160 (e.g., a micro-processor, a digital signal processor (DSP), etc.) and a memory module 180 having one or more computer-readable storage devices (e.g., memories). For example, the memory module 180 may include an electrically erasable programmable read-only memory (EEPROM) 182, a flash memory 184, and/or a random access memory (RAM) 186. An interface 178, which connects the processor 160 to the memory module 180, may be any known interface compatible with the particular memory devices 182, 184, 186 and with the particular processor 160. The processing module 120 may also include additional elements, such as a real-time clock 196, a backup power source (e.g., a battery) 194, and various other support circuitry 192. It is envisioned as part of the present disclosure that the processing module 120 may incorporate all elements such as processor 160 and memories 180 or any other peripheral via on-board chip connections in which the functions are included as part of a single semi-conductor device. It is also envisioned that these modules can be located in separate devices and in a combination of on-board and separate devices.

Figure 3:
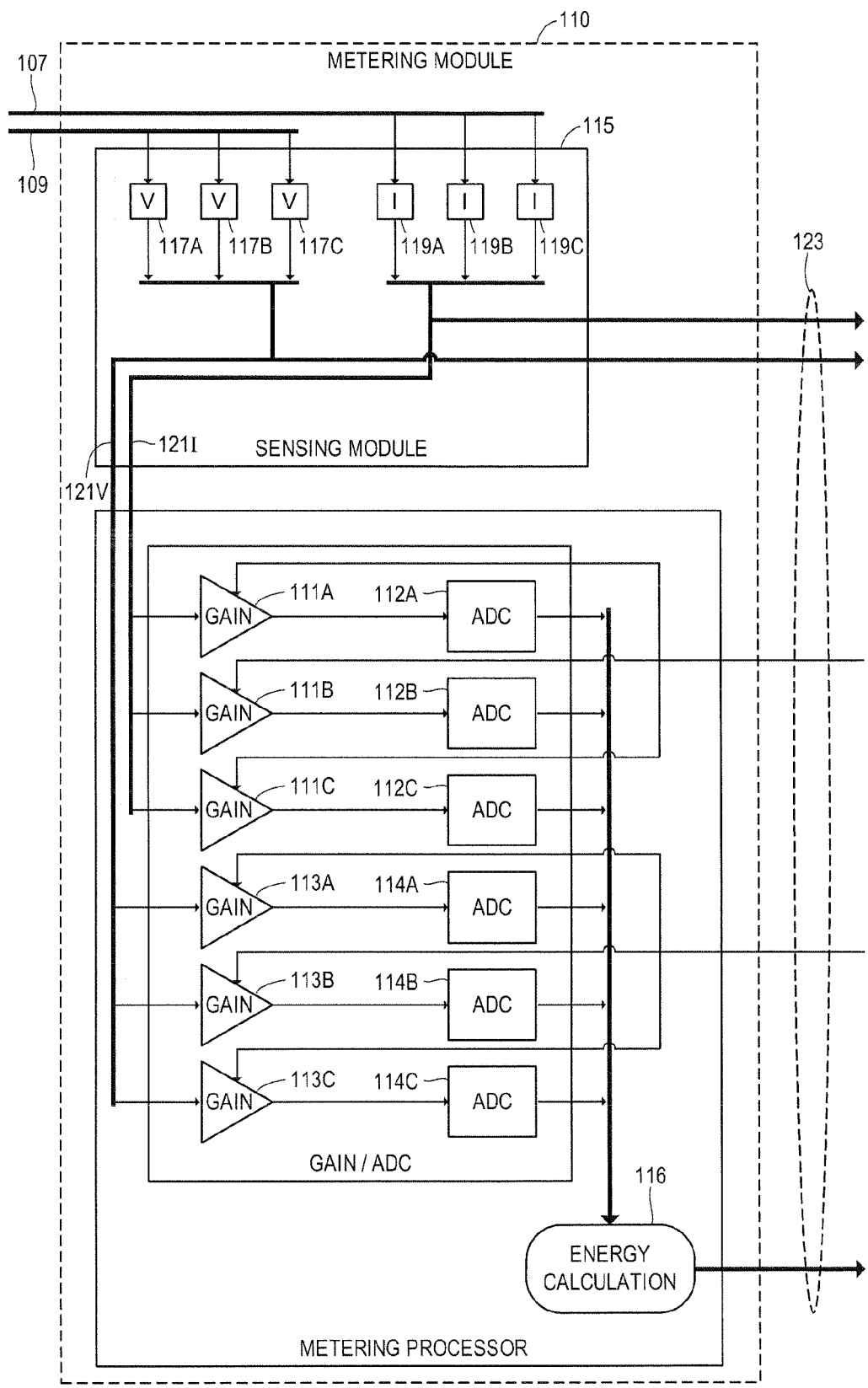
FIG. 3 is a block diagram illustrating a metering module of the exemplary meter of FIG. 2.

Referring now to FIG. 3, the voltage sensing circuitry 117 in the sensing module 115 may include three voltage dividers or potential (or voltage) transformers (i.e., one for each of electrical phases A, B, and C) 117A, 117B, 117C for proportionally decreasing the voltage sensed by the metering module 110. The current sensing circuitry 119 may include three conductors (i.e., one for each of electrical phases A, B, and C), each passing through a toroidal coil 119A, 119B, 119C, a current transformer or some other type of current sensing device such as current shunts, rogowski coil, etc. The voltage sensing circuitry 117 and the current sensing circuitry 119 generate signals representative of the three voltages phases and the three current phases, respectively.

The plurality of signals representative of the voltage and current are communicated from the sensing module 115 to the metering processor 118 via, for example, interfaces 121V and 121I. The interfaces 121 may be any suitable interfaces, including, if the sensing module 115 and the metering processor 118 are on a single PCB, traces embedded in the PCB. In one embodiment, the signals representative of the voltage and current are received by the metering processor 118. The metering processor 118 includes circuitry 112A, 112B, 112C, 114A, 114B, 114C for converting the analog signals representative of the sensed currents and voltages to digital signals (e.g., using analog-to-digital converters (ADCs)), and circuitry 111A, 111B, 111C, 113A, 113B, 113C for applying a gain factor to the signals to effectively utilize the full resolution of the ADCs. Of course, the ADCs 112A, 112B, 112C, 114A, 114B, 114C and/or the gain circuitry 111A, 111B, 111C, 113A, 113B, 113C, may be discrete components and need not be included within the metering processor 118. While the metering processor 118 illustrated in FIG. 3 includes three current ADCs 112A, 112B, 112C and three voltage ADCs 114A, 114B, 114C (e.g., one ADC for each of the sensed signals), fewer ADCs may be used if employed in combination with a plurality of sample-and-hold registers and multiplexers. In such an application, one ADC may convert the voltage values and one ADC may convert the current values. Of course, the ADCs must operate fast enough to perform all three (or six) conversions before the sample time has elapsed. For example, if two ADCs are employed (one each for voltage and current), and if each phase is to be sampled 10 times per second (or every 100 ms), each ADC must be capable of performing at least 30 analog-to-digital conversions each second (one every 100 ms for each of the three phases).

Each gain circuit 111A, 111B, 111C, 113A, 113B, 113C may include one or more gain-controlled amplifiers. Each gain-controlled amplifier may selectively amplify a single output signal of the sensing circuit (i.e., an input signal of the gain circuit), according to a corresponding gain factor. The processing module 120 may program the gain factor for each of the gain circuits 111A, 111B, 111C and 113A, 113B, 113C, for example, by setting a register (not shown) in the metering processor 118 through the interface 123. The gain factor for each of the amplifiers in the gain circuits 111A, 111B, 111C, 113A, 113B, 113C may be selected from a plurality of gain factors prior to measuring the output of the sensing circuit 117, 119, such as by selection via the user-interface 130 when a user knows the appropriate gain factor for the electrical service 101 to which the meter 100 is connected. Alternatively, the gain factor for each of the amplifiers in the gain circuits 111A, 111B, 111C, 113A, 113B, 113C may be selected in response to measuring the output of the sensing circuitry 117, 119, allowing the meter 100 to adjust the gain factors automatically and without user intervention and thereby allowing the meter 100 to operate on any electrical service to which it is connected. It should be recognized that the gain factors selected for each of the gain-controlled amplifiers need not be the same. Moreover, the plurality of gain factors available for the gain-controlled amplifiers of the current gain circuit 111A, 111B, 111C, need not be the same as those available in the voltage gain circuit 113A, 113B, 113C.

A measurement parameter calculation routine 116 running on the metering processor 118 uses the digital outputs of the ADCs 112A, 112B, 112C, 114A, 114B, 114C to determine the power or energy on each phase (i.e., by multiplying the current by the voltage). The metering processor 118 communicates the results of the energy calculations across the interface 123 to the processing module 120. Of course, the gain circuitry 111A, 111B, 111C, 113A, 113B, 113C, the ADCs 112A, 112B, 112C, 114A, 114B, 114C, and the energy calculation routine need not be in a single chip such as in the metering processor 118. For example, the current gain circuitry 111A, 111B, 111C and the voltage gain circuitry 113A, 113B, 113C may each be a multi-channel variable gain amplifier, while the current ADCs 112A, 112B, 112C and the voltage ADCs 114A, 114B, 114C may each be a multi-channel ADC package. In such an implementation, the power or energy calculation may be implemented on a specialized metering chip or a stand-alone DSP.

Figure 4:
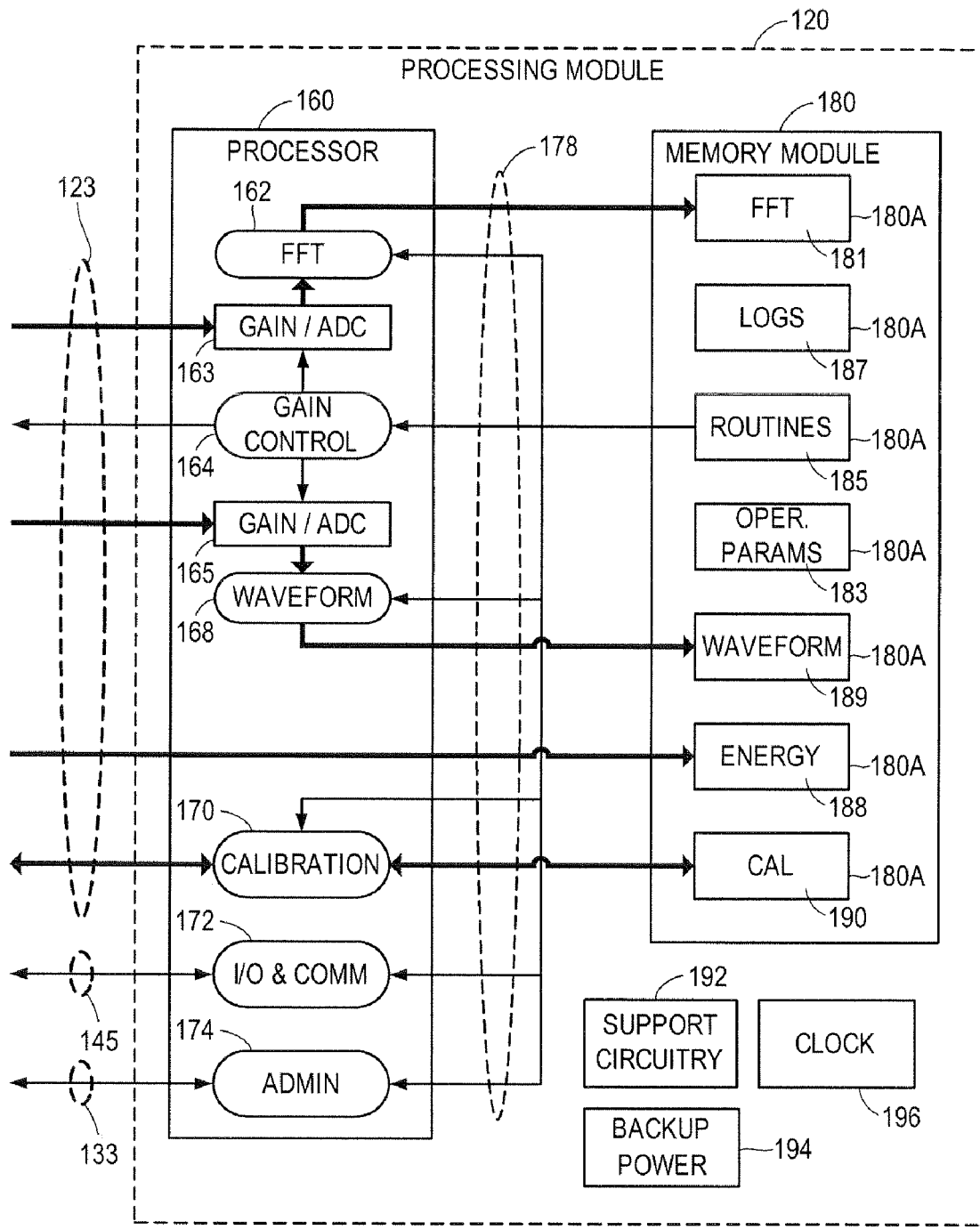
FIG. 4 is a block diagram illustrating a processing module of the exemplary meter of FIG. 2.

Referring now to FIG. 4, the memory module 180 may store data related to the operation of the meter 100 in a plurality of areas 180A of the memory module 180. These data may include operating parameters data 183 such as the settings of the device (e.g., alarm triggers, communication configurations, data formats, etc.); measured parameter data 181 such as harmonic information and Fourier transforms; waveform data 189; power or energy calculation data 188; various log data 187 of power quality events (e.g., sags, swells, transients, etc.); a plurality of routines 185 necessary to operate the meter 100 (e.g., gain control routines, waveform capture routines, calibration routines, etc.); and calibration data and/or tables 190. As used herein, the term "calibration data" refers to calibration factors, and is used interchangeably as such. As described below, the calibration factors may be offset data ("offset calibration factors") or linear slope data ("linear calibration factors") or other types of calibration factors. The data stored within the memory module 180 may be stored in the memory module 180 in any manner known by those of ordinary skill in the art. Moreover, these data need not be stored in a single device (such as the EEPROM 182, the flash memory 184 or the RAM 186). For example, the routines 185 and calibration data 190 may be stored in the EEPROM 182, the log data 187 stored in the flash memory 184, and the remainder of data stored in the RAM 186.

One or more buses 178 communicatively connect the memory module 180 to the processor 160, depending on the processor and memory devices employed. As shown in FIG. 4, the processor 160 may also serve to communicatively couple the memory module 180 to the other modules, such as to the metering module 110 (e.g., by the buses 178 and 123). This connection may be necessary, for example, to facilitate storage of energy measurements, to implement gain control in the metering module 110, or to facilitate storage or retrieval of calibration data, as will be discussed in detail below.

The processor 160 runs or executes the routines 185 stored in the memory module 180, and generally performs calculations and otherwise manipulates data, in addition to administering operation of the meter 100. The routines 185 may include, by way of example and not limitation, an FFT routine 162, a gain control routine 164, a waveform capture routine 168, a calibration routine 170, I/O & communication routines 172, and administration routines 174.

In addition to the routines 185 described above for administering operation of the meter 100 and processing data obtained using the metering module 110, the processing module 120 may additionally execute one or more routines for implementing virtual relay logic functionality. Virtual relay logic functionality allows a user to configure the meter 100 to monitor one or more parameters, and to detect when a numerical value of the parameter meets or exceeds a pre-determined threshold. The pre-determined threshold may be programmed by the user directly or via a remote terminal (i.e., sending threshold settings to the processing module 120 via the communication module 140), and may include, for example, a minimum value or a maximum value for the parameter. The parameter monitored in the virtual relay may be any parameter measured by the meter 100, including actual or root mean square (RMS) values of a line voltage, a line current, a phase voltage, a phase current, or a total harmonic distortion, or may be energy, revenue, real power, reactive power, total power, or a power factor. When an "event" is detected, the processing module 120 may be configured to record the settings, timing, and values associated with the event, or to transmit the information pertaining to the event to a remote terminal, for display or storage on the remote terminal. Moreover, information pertaining to events may also be reported or signaled to a device external to the meter 100 by changing a state of a relay contact or a solid state contact, changing a state of a digital output on one of the I/O cards, or changing a numerical value of an analog signal. In addition to logic checking, virtual relay logic also allows users to add additional parameters as defined in the programming section to include parameters like and/or/nand/nor or any other desired logical descriptor. Moreover, the logic could further be used to obtain custom calculations such as conversion from Watts to horsepower or to determine BTUs or the convert energy usage to dollar cost, etc. Moreover, the logic may incorporate complex instructions like to run specific executable code upon event or to allow users to custom program and configure the meter (or IED) using code or programming to add new functionality not envisioned by the developer.

Additionally, the processor 160, may include circuitry 163 and 165 for implementing gain control on the additional voltage and current signal channels coming from the sensing module 115 as part of the interface 123 and converting the analog signals representative of the sensed currents and voltages to digital signals (e.g, using one or more ADCs). The processor 160 may use the additional channels, each of which includes a voltage signal and a current signal for each phase of the electrical service 101, and the corresponding circuitry 163 and 165 for metering tasks that require different gain factors than the gain factors used in the energy metering functions executed on the metering module 110 to fully utilize the dynamic range of the corresponding ADC. In particular, the processor 160 may use one of the additional signal channels to provide waveform capture functionality. In contrast to calculating energy consumption (or generation), waveform capture typically requires a much larger dynamic range to capture transients such as voltage spikes (which may exceed the nominal voltage of the system by orders of magnitude). The processor 160 may use another additional voltage signal channel and current signal channel for calculating harmonic effects in the electrical service, as capturing this information may require yet a different dynamic range, and thus a different gain setting.

While a single processor 160 is illustrated in the embodiment depicted in FIGS. 2 and 4, the processor 160 may be one or more processors (e.g., two micro-processors, a microprocessor and a DSP, etc.). Likewise, while FIG. 4 depicts the gain and ADC circuitry 163 and 165 as disposed within the processor 160, these components may be implemented separately from the processor 160 in any known manner, such as those described above with reference to the circuitry in the metering processor 118.

Figure 5:
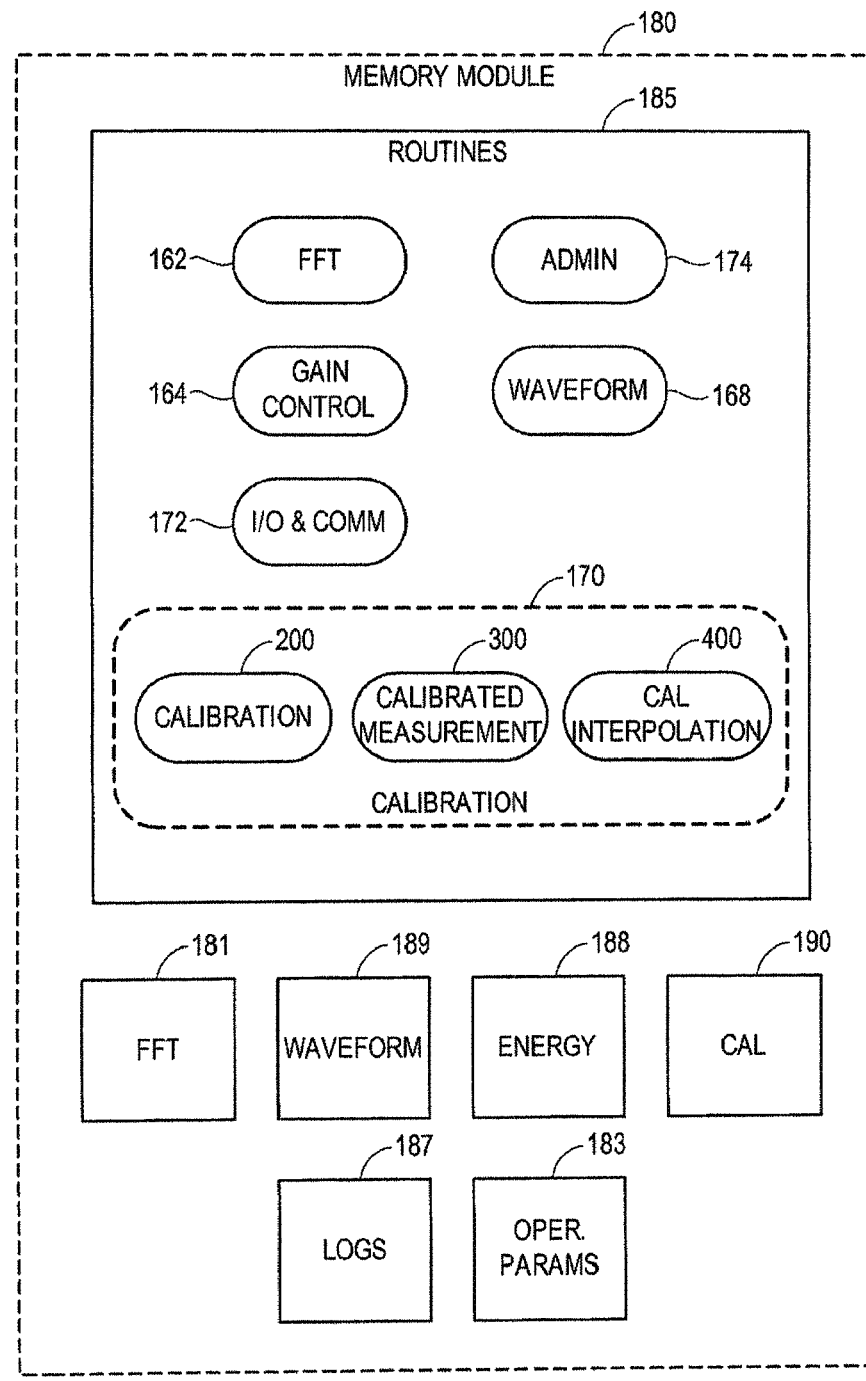
FIG. 5 depicts the various contents of the memory module of FIG. 4.

The following paragraphs describe the calibration features of the meter 100. As described above, the processor 160 runs the plurality of routines 185, which include one or more calibration routines 170. With reference now to FIG. 5, the calibration routines 170 may include, for example, a routine 200 for determining and storing one or more calibration factors, which calibration factors are indicative of the error between the actual value of a measured parameter and the measured value of the parameter. The routine 200 may calculate and store the one or more calibration factors for each desired calibration range in which the meter is to operate. The calibration routines 170 may also include a routine 300 for using the stored calibration factors determined by the routine 200 such that the measurement data reported or recorded by the meter 100 represents the actual value of the measured parameter. The calibration routines 170, examples of which are described in more detail below, may also optionally include a routine 400 for interpolating stored calibration factors to determine additional calibration factors as described below. The meter 100 may implement each of the calibration routines 170 using multiple different methods, and each method may use one of several types of calibration factors. Some of these methods will be described below.

Figures 6A, 6B:
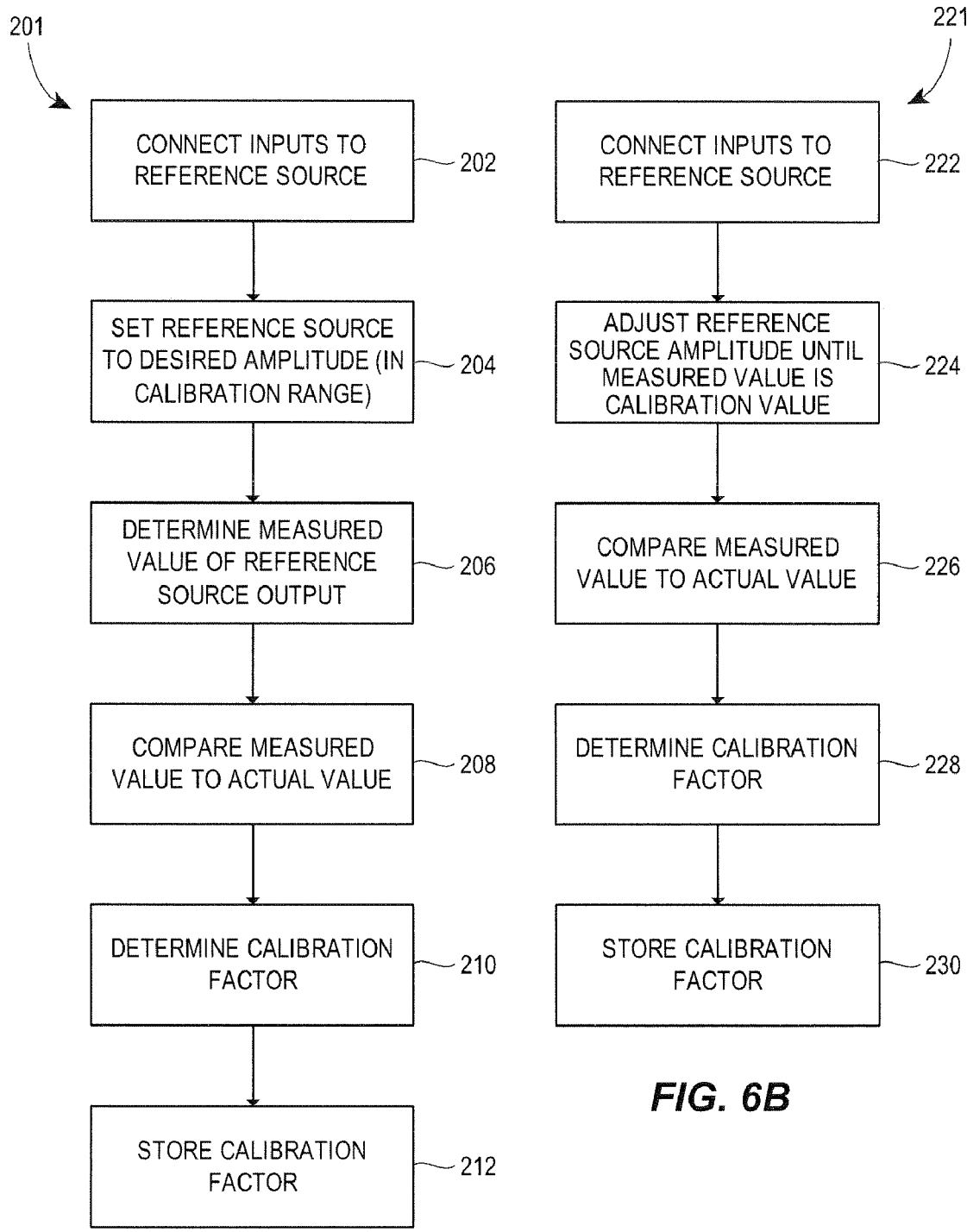
FIGS. 6A & 6B illustrate alternative methods for calibrating a digital electrical power and energy meter.

FIG. 6A depicts a flow chart describing a method 201, corresponding to the routine 200, for determining one or more calibration factors corresponding to a measured parameter in the IED. In a first step 202, the meter 100 is connected, via the interface 107 or 109 to a reference current and/or voltage source, respectively, such as to the calibration reference 102, depicted in FIG. 2. The calibration reference 102 provides a known current and/or voltage signal, at a known (and usually selectable) amplitude, to allow a comparison between the actual value of the parameter being calibrated and the value of the parameter as measured by the meter 100. In a step 204, the calibration reference 102 is set to provide a known signal amplitude in the calibration range. For example, to calibrate the voltage measurements of the meter 100 in the 277 V calibration range (which range has a full-scale value of 500 V, thereby giving it a range of 0 V to 500 V, inclusive), the calibration reference 102 may first be set to 20.000 V. In a step 206, the value of the signal as measured by the meter 100 is determined. In a step 208, the measured value is compared to the actual value (i.e., the reference value). Using the measured and actual values of the parameter (e.g., the voltage), step 210 determines a calibration factor. Of course, the calibration factor may be, for instance, an offset calibration factor (i.e., a value that should be added or subtracted from the measured value of the parameter to determine the actual value of the parameter), a linear calibration factor (i.e., a value that should be multiplied with the measured value of the parameter to determine the actual value of the parameter), or some combination of offset and linear calibration factors. Alternatively, the calibration factor may be determined according to calculations of average values or some other statistical method. Moreover, an offset calibration factor may be a fixed offset or a variable offset, which variable offset varies according to some predetermined formula or criteria. At a step 212, the determined calibration factor is stored in the memory module 180 (preferably in a non-volatile memory such as the EEPROM 182 in FIG. 2) and, in particular, the calibration factor may be stored as associated with the measured value of the parameter.

FIG. 6B depicts a flow chart describing an alternative method 221 for calibrating a measured parameter in the IED. In a first step 222 the meter 100 is connected, via the interface 107 or 109 to a reference current source and/or a reference voltage source, respectively, such as to the calibration reference 102, depicted in FIG. 2. In a step 224, the calibration reference 102 is adjusted until the signal amplitude provided by the calibration reference 102 causes the meter 100 to measure a desired value in the calibration range. For example, to calibrate the voltage measurements of the meter 100 in the 277 V calibration range, the calibration reference 102 may be adjusted until the value measured by the meter 100 is 20.000 V. This may correspond to an actual value (i.e., the value provided by the calibration reference 102) of 19.802 V. At a step 226, the measured value is compared to the actual value (i.e., the reference value). A step 228 then uses the measured and actual values of the parameter (e.g., the voltage) to determine a calibration factor. As described above, the calibration factor may be an offset calibration factor, a linear calibration factor, or any other type of calibration factor. At a step 230, the determined calibration factor is stored in the memory module 180.

In either of the methods 201 and 221, the calibration factor may be determined using known methods. For example, a linear calibration factor (wherein multiplication of a measured value of a parameter by the calibration factor converts the measured value of the parameter to the actual value of the parameter), may be determined by dividing the reference value (i.e., the actual value of the parameter) by the value of the parameter as measured. This computation may be expressed as:

$$F = \frac{X_R}{X_M}$$

where F is the calibration factor, $X_R$ is the reference value of the parameter, and $X_M$ is the value of the parameter as measured by the meter 100. Likewise, an offset calibration factor (wherein adding the calibration factor to a measured value of a parameter converts the measured value of the parameter to the actual value of the parameter), may be determined by finding the difference between the reference value and the value of the parameter as measured. This calculation may be expressed as:

$$F = X_R - X_M$$

Moreover, the steps 202 to 212 (or the steps 222 to 230) may be repeated for each of the values in a particular calibration range. Assuming, for example, that the calibration range is 277 V, calibration measurements may be made (and calibration factors determined) in, for example, 20 V increments (e.g., at 20 V, 40 V, 60 V, etc.). In this manner, a plurality of calibration factors may be determined for the 277 V range of measurements. It should be noted that the number of measurements in a given calibration range may be as few as one. For example, in one alternative method for calibrating a range of signals, calibration measurements may be made at the range value (e.g., 277 V) and the full-scale value for that range (e.g., 500 V), instead of at smaller increments within the range. Alternatively, the meter 100 may determine one or more calibration factors using averaging or other statistical techniques. Moreover, the method 201 (or the method 221) may be repeated, for each of the calibration ranges, at multiple frequencies (e.g., 50 Hz and 60 Hz), to allow the meter 100 to operate with improved accuracy regardless of the nominal operating frequency of the electrical system 101. The meter 100 may store the determined calibration factor or factors as an individual value (e.g., where there is a single offset calibration factor or linear calibration factor for each calibration range) or in a look-up table or other data structure (e.g., where multiple offset or linear calibration factors exist for each calibration range).

FIGS. 7A and 7B depict an example set of calibration measurements and a set of example linear calibration factors determined from the measurements that might result from the methods 201 and 221, respectively. As will be seen, the tables 240 and 260 have five columns. A column 242 depicts example values of signals generated by the calibration reference 102. A column 244 depicts example values of the signals generated by the calibration reference 102, as measured by the meter 100. A column 246 depicts the calibration factor calculated using the values in the columns 242 and 244. Lastly, columns 248 and 250 depict the error for the particular example reference value before and after application of the calibration factor, respectively. For example, the first row in the column 242 of the table 240 shows a reference value of 20.00 V, while the column 244 of the table 240 indicates that the value measured by the meter 100 was 18.76 V. Thus, there is a measurement error of 6.200% (indicated in the column 248 of the table 240). By comparison, after application of the corresponding calibration factor as depicted in the column 246 of the table 240, the error is less than 0.2% (as depicted in the column 250 of the table 240).

The method 201 shown in FIG. 6A (or the method 221 shown in FIG. 6B) is repeated for each of the desired calibration ranges (e.g., 69 V, 120 V, 277 V, etc.). Thus, subsequent to calibration, the memory module 180 of the meter 100 will contain calibration data 190 for each of the desired calibration ranges, allowing the meter 100 to operate with the desired accuracy (e.g., less than 0.2% error) in any of its intended operating ranges. Of course, the calibrated parameters need not be restricted to voltage and current. Additional parameters and/or measurements may also be calibrated in each of any number of desired calibration ranges. These parameters and/or measurements may include, by way of example and not limitation, RMS current, RMS voltage, phase, apparent power, reactive power, active power, frequency, etc.

Figure 8:
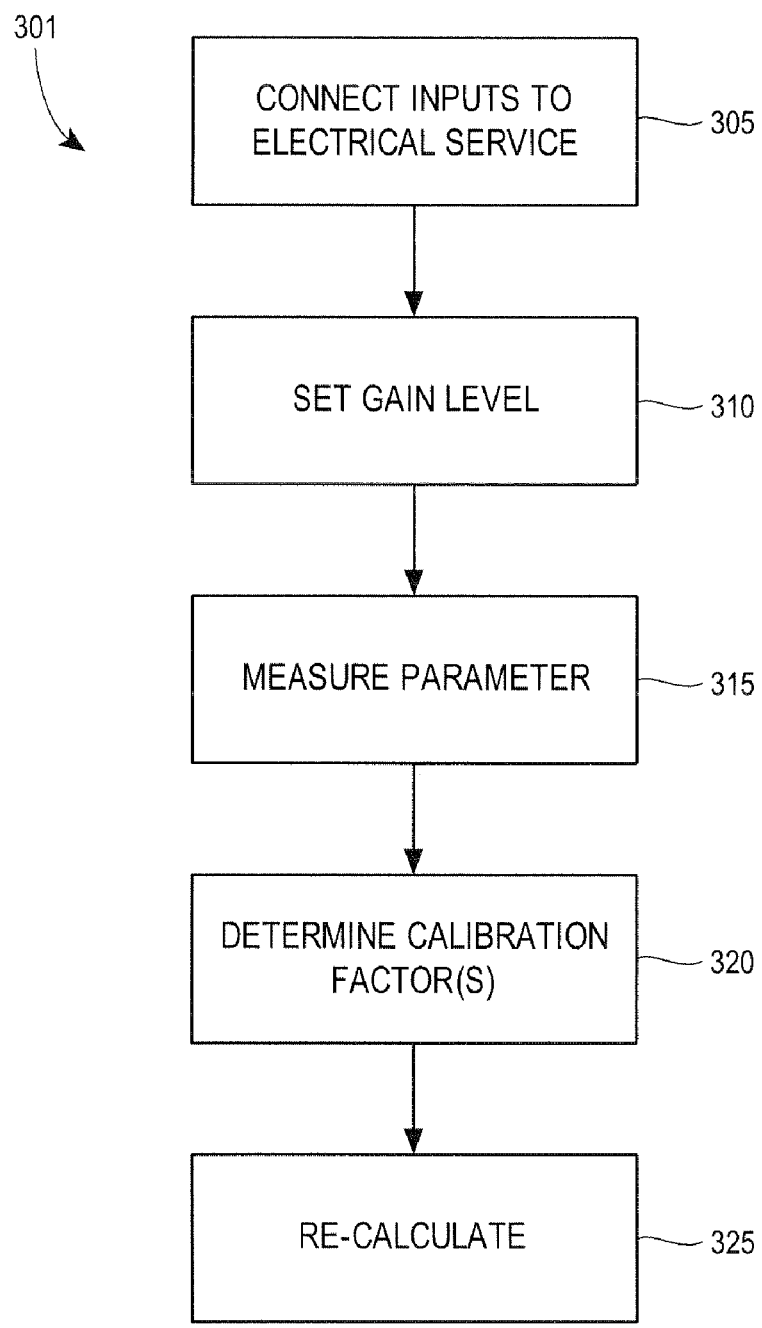
FIG. 8 illustrates a method for applying a set of calibration factors to a plurality of measurements.

FIG. 8 depicts a method 301, that may be implemented by the routine 300, for using the stored calibration factors determined by the routine 200 and stored in the memory module 180 to determine a calibrated measurement (i.e., an actual value) of the measured parameter. In a step 305, the meter 100 is connected, via the interface 107 or 109 to an electrical service 101 which operates at a nominal voltage with a nominal frequency. Further, the load (not shown) on the electrical service 101 draws current at some nominal capacity.

At a step 310, the processing module 120 assesses the appropriate gain for each of the measured current and voltage signals by first assessing the nominal values of the voltage and current in the electrical system 101 (i.e., ignoring the effects of transients, harmonics, etc.). The processing module 120 then determines the industry standard nominal value for the voltage (e.g., 69 V, 120 V, 230 V, 277 V, 347 V, 416 V, 721 V, etc.) and the industry standard nominal range for the current (e.g., 0-1 A, 0-5 A, or 0-10 A). Next, the processing module 120 selects the appropriate voltage gain and the appropriate current gain to optimally utilize the full resolution of the ADCs 112A, 112B, 112C, 114A, 114B, 114C.

Those of ordinary skill in the art will appreciate that gain adjustments for the supply voltages and currents may be performed in a real time (i.e., dynamically) by a gain control routine 164 or, alternatively, the gain factors for the amplifiers 111A, 111B, 111C, 113A, 113B, 113C may be pre-configured via the user interface 130 based on known characteristics of the electrical service 101 or electrical load, which power consumption is monitored using the meter 100. Additionally, the gain control routine 164 may operate within the processor 160 of the metering module 120, as described above and as depicted in FIG. 4, or may operate within the metering processor 118. Further, the nominal values of the voltage and the current in the electrical system 101 may be determined from the output of the sensing module 115 (i.e., the voltage sensing circuitry 117 and current sensing circuitry 119) or, alternatively, from the output of the metering processor 118. Thus, in operation, the step 310 allows the meter 100 to perform measurements of the voltages and currents, regardless of their nominal values, with the same high accuracy in the respective operating ranges of the meter 100.

At a step 315, the meter 100 measures the parameter to which calibration data is to be applied. For example, if calibration data exists for RMS voltage measurements (e.g., as the stored calibration data 190 within memory module 180), the meter 100 measures the RMS voltage of the electrical service 101.

The processing module 120 determines one or more appropriate calibration factors in a step 320. The appropriate calibration factors may be selected based on one or more criteria including, for example, the amplitude of measured parameter, the gain factors applied to the current and/or voltage inputs, and the calibration range in which the meter 100 is operating (e.g., if the meter is attached to a 277 V system, the calibration factors for the 277 V calibration range may be selected).

At a step 325, the meter 100 uses the one or more calibration factors determined in the step 320 to calculate a calibrated measurement (i.e., an actual value) of the measured value of the parameter. Calculating the measured value of the parameter to find the actual value of the parameter may require multiplying the measured value by the linear calibration factor. This action may be expressed mathematically as:

$$X_A = X_M * F$$

where $X_A$ is the actual value of the parameter, $X_M$ is the measured value of the parameter, and F is the chosen calibration factor. Alternatively, calculating the measured value of the parameter to find the actual value of the parameter may require adding the offset calibration factor (where offset calibration factors are employed instead of linear calibration factors) to the measured value of the parameter. This operation may be expressed mathematically as:

$$X_A = X_M + F$$

The re-calculated data (i.e., $X_A$) for the parameter is then selectively stored in the memory module 180, displayed on the user interface 130, and/or forwarded to a pre-determined addressee (e.g., another module, a personal computer, etc.) via the I/O module 135 or the communications module 140.

Figures 9A, 9B:
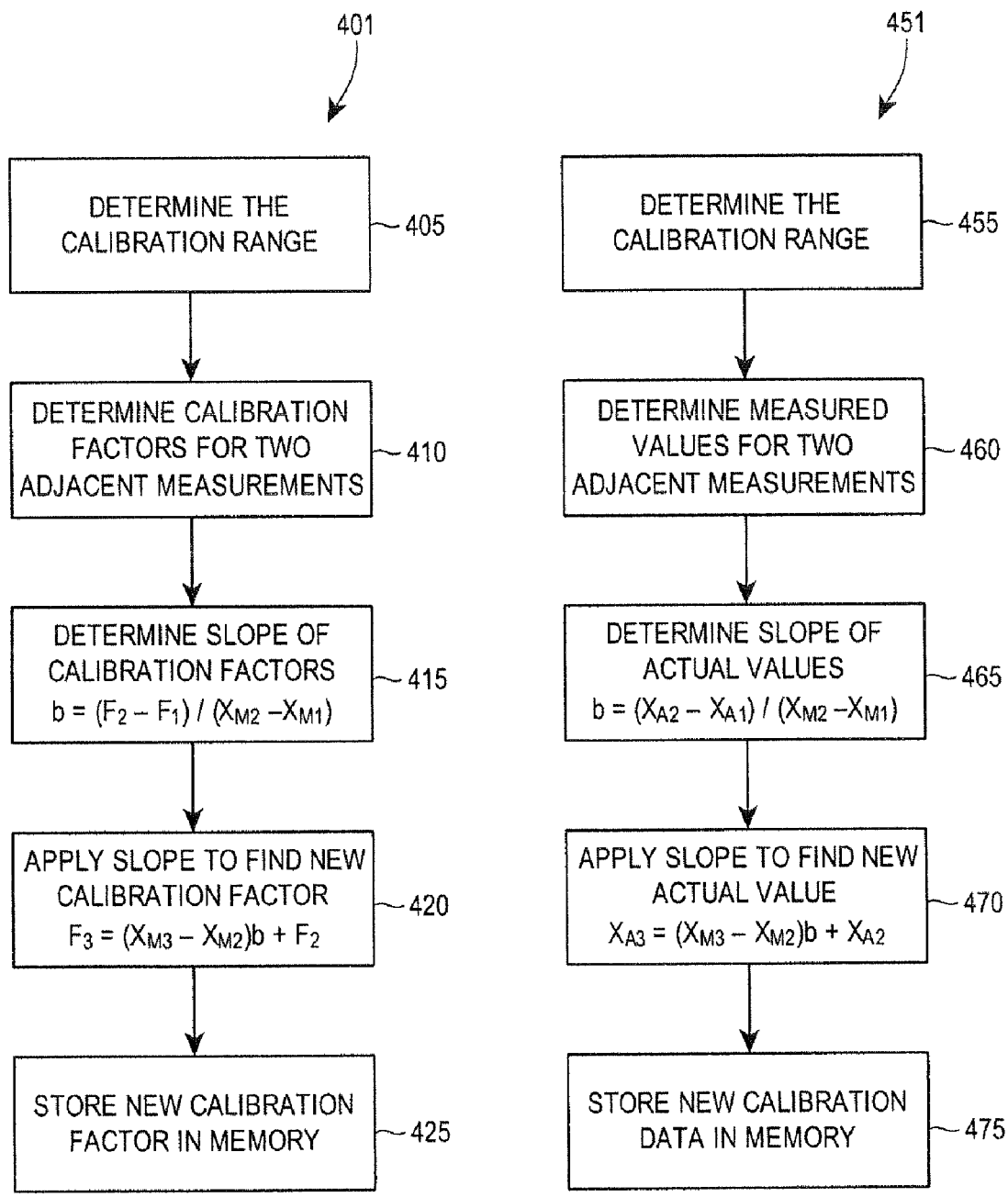
FIGS. 9A and 9B depict two alternate methods for using interpolation to achieve accurate measurements.

FIGS. 9A and 9B depict methods 401 and 451 for determining one or more additional calibration factors using interpolation of the previously determined and stored calibration factors. The calibration method 201, described above, results in the calibration factors stored in the memory module 180. While application of these calibration factors in accordance with, for example, routine 300, produces accurate measurements at the calibration values for which measurements were taken, any measured value that falls between two adjacent values for which calibration factors exist may not be as accurate. For example, if calibration measurements were made (and corresponding calibration factors determined and stored) at 20 V and 40 V, a measured value between 20 V and 40 V would have no corresponding calibration factors. While in some circumstances one may be able to provide the required accuracy (e.g., less than 0.2% error) by applying calibration factors for one or the other of the two adjacent calibration measurements, increased accuracy may be provided by using interpolation to find a more accurate calibration factor.

The method 401 of FIG. 9A determines one or more additional calibration data points using interpolation of the stored calibration data. In a first step 405, the processing module 120 determines the calibration range in which the meter 100 is operating. Calibration factors ($F_1$ and $F_2$) for the two measured values ($X_{M1}$ and $X_{M2}$) of the parameter at which adjacent calibration measurements were taken are determined in a step 410. For example, where the measured value ($X_{M3}$) of the parameter is 30 V, the two measured values ($X_{M1}$ and $X_{M2}$) adjacent points at which calibration measurements were taken may be 20 V and 40 V, and the corresponding linear calibration factors ($F_1$ and $F_2$) may be 1.100 and 1.300, respectively.

At a step 415, the processing module 120 determines the slope b of a line drawn between the linear calibration factors. The slope b of such a line between the linear calibration factors may be determined by the equation:

$$b = \frac{(F_2 - F_1)}{(X_{M2} - X_{M1})}$$

In the example above, $F_1$ and $F_2$ are 1.100 and 1.300, respectively, and $X_{M1}$ and $X_{M2}$ are 20 V and 40 V, respectively. Therefore, b=0.10.

Having found the slope b, the processing module 120 applies the slope to find the new calibration factor $F_3$ in a step 420. The calibration factor $F_3$ may be determined by the equation:

$$F_3 = (X_{M3} - X_{M2})b + F_2$$

Applying this equation in the example above to find a calibration factor to apply to a measured value of 30 V (i.e., $X_{M3}$=30 V), it is determined that the calibration factor $F_3$ is 1.200. This new calibration factor may be applied to the measured value to find the actual value ($X_{A3}$) in the same manner as described with reference to the method 301 (i.e., $X_{A3} = F_3 * X_{M3}$). Optionally, a step 425 may store the newly determined calibration factor for future use with the other calibration data 190 in the memory module 180. Alternatively, the step 425 may store other or additional data, such as the slope b of the line between the calibration factors.

Interpolation may also be applied to the values of the measured signals used to calibrate the meter 100, as shown in the method 451 of FIG. 9B. At a first step 455, the processing module 120 determines the calibration range in which the meter 100 is operating. A step 460 then determines the actual values ($X_{A1}$ and $X_{A2}$) for the two measured values ($X_{M1}$ and $X_{M2}$) of the parameter at which adjacent calibration measurements were taken. For example, where the measured value of the parameter ($X_{M3}$) is 30 V, the two measured values ($X_{M1}$ and $X_{M2}$) at which adjacent calibration measurements were taken may be 20 V and 40 V, and the corresponding actual values ($X_{A1}$ and $X_{A2}$) may be 19.802 V and 38.835 V, respectively. The processing module 120 may find the corresponding actual values ($X_{A1}$ and $X_{A2}$) by calculating these actual values using the calibration factors ($F_1$ and $F_2$) stored in the memory module 180 as associated with the measured values ($X_{M1}$ and $X_{M2}$). This calculation may be expressed as:

$$X_{A1} = \frac{(X_{M1})}{(F_1)}$$

$$X_{A2} = \frac{(X_{M2})}{(F_2)}$$

Alternatively, the actual values corresponding to the measured values could be stored in addition to, or instead of, the calibration factors, and the actual values may be retrieved directly from the memory module 180 instead of being calculated. Of course, both of methods 401 and 451 may also be used to determine, by interpolation, additional offset calibration factors.

At a step 465, the processing module 120 determines the slope b of the actual values. The slope b of the actual values may be determined by the equation:

$$b = \frac{(X_{A2} - X_{A1})}{(X_{M2} - X_{M1})}$$

In the example above, $X_{A1}$ and $X_{A2}$ are 19.802 V and 38.835 V, respectively, and $X_{M1}$ and $X_{M2}$ are 20 V and 40 V, respectively. Therefore, in this example, b=0.001.

Having found the slope b, the processing module 120 uses the slope b to find the new actual value $X_{A3}$ in a step 470. The actual value $X_{A3}$ may be determined by the equation:

$$X_{A3} = (X_{M3} - X_{M2})b + X_{A2}$$

Applying this equation in the example above to find the actual value $X_{A3}$ of a measured value of 30 V (i.e., $X_{M3}$=30 V), it is determined that the actual value $X_{A3}$ is 29.319 V. Of course, if desired, a step 475 may store this value in the memory module 180 for future use.

The above procedures may also be used to determine, by interpolation, calibration factors (or calibrated measurement values) at frequencies other than the frequencies at which the meter 100 may be calibrated (e.g., 50 Hz and 60 Hz). The extrapolation process starts with determining the two (but not limited to) calibration factors closest to the range of the measured parameter. The next step is to apply the extrapolation algorithm to determine the approximated calibration factor at the given point where the parameter is measured at. The extrapolation algorithm calculates the magnitude difference of the two factors (factor 1, factor 2), and then calculates the ratio of the variable range between the measurement point and factor 1, and the range between factor 1 and factor 2. By applying this ratio with the predetermined mathematical function (extrapolation type) to the factors' magnitude difference and adding it to factor 1 magnitude, results the new factor for the measured parameter. Other variables can have their own calibration factors and can be used on measurements at any given point using an interpolation algorithm. It is envisioned by this application that the algorithm type, (linear, cube, polynomial, etc.) is selectable to the variable type that best fits the transfer curve. This is based on the characterization of the measurements needed over the variable range. This technique is not limited to amplitude calibrations and for frequency but could also apply to temperature, drift, time, phase angle or any other type of movement of the measured parameter.

The calibration of the meter 100 over multiple input ranges is advantageous, particularly when combined with multiple gain channels as is disclosed herein. As described above, each independently-adjustable gain channel allows the meter to use the associated analog-to-digital converter in the most appropriate resolution for the channel's dedicated task, while the plurality of ranges over which the meter 100 is calibrated allows improved accuracy across multiple input ranges. Thus, the combination of features allows the meter 100 to accurately measure some electrical parameters (e.g., current, voltage, etc.) over a wide range of input values, while still providing sufficiently detailed capture and/or analysis of other electrical parameters (e.g., waveform, harmonics, etc.).

Although the foregoing text sets forth a detailed description of numerous embodiments, it should be understood that the legal scope of the present disclosure is defined by the words of the claims set forth at the end of this patent. The detailed description is to be construed as exemplary only and does not describe every possible embodiment, as describing every possible embodiment would be impractical, if not impossible. As a result, one could implement numerous alternate embodiments, using either current technology or technology developed after the filing date of this patent, which would still fall within the scope of the claims.

It should also be understood that, unless a term is expressly defined in this patent using the sentence "As used herein, the term '_____' is hereby defined to mean . . . " or a similar sentence, there is no intent to limit the meaning of that term, either expressly or by implication, beyond its plain or ordinary meaning, and such term should not be interpreted to be limited in scope based on any statement made in any section of this patent (other than the language of the claims). To the extent that any term recited in the claims at the end of this patent is referred to in this patent in a manner consistent with a single meaning, that is done for sake of clarity only, so as to not confuse the reader, and it is not intended that such claim term be limited, by implication or otherwise, to that single meaning. Finally, unless a claim element is defined by reciting the word "means" and a function without the recital of any structure, it is not intended that the scope of any claim element be interpreted based on the application of 35 U.S.C. §112, sixth paragraph.

Still further, while the figures and description herein are specifically directed to digital electrical power and energy meters, including revenue-quality certified meters, the concepts disclosed in the present application may also be applied in the context of other types of Intelligent Electronic Devices (IEDs) including, for example, Programmable Logic Controllers (PLCs), Remote Terminal Units (RTUs), protective relays, fault recorders, and other devices or systems used to quantify, manage, and control quality, distribution, and consumption of electrical power. Thus, as used herein, the term "digital electrical power and energy meter" refers broadly to any IED adapted to record, measure, communicate, or act in response to one or more parameters of an electrical service. These parameters may include, for example, supply currents and supply voltages, their waveforms, harmonics, transients, and other disturbances, and other corresponding parameters, such as power, power quality, energy, revenue, and the like. A variety of electrical service environments may employ IEDs and, in particular, digital electrical power and energy meters. By way of example and not limitation, these environments include power generation facilities (e.g., hydroelectric plants, nuclear power plants, etc.), power distribution networks and facilities, industrial process environments (e.g., factories, refineries, etc.), and backup generation facilities (e.g., backup generators for a hospital, a factory, etc.).

Thus, although the disclosure herein has been described with reference to particular illustrative embodiments, it is to be understood that these embodiments are merely illustrative of the principles and applications of the present disclosure. Therefore, numerous modifications may be made to the illustrative embodiments and other arrangements may be devised without departing from the spirit and scope of the present disclosure.

I claim:

1. An intelligent electronic device comprising:
a sensing circuit having one or more sensors for sensing at least one parameter of an AC electrical service, each of the one or more sensors generating a first signal representative of the sensed parameter;
a plurality of gain-adjustable channels, each channel having at least one gain adjustment circuit for individually adjusting a gain factor and each channel comprising at least one first signal generated by the one or more sensors, the at least one first signal representative of the sensed parameter, wherein the plurality of gain-adjustable channels include a first channel for energy calculations, a second channel for harmonics calculations, and a third channel for waveform capture;
one or more computer-readable storage devices; and
a plurality of calibration factors stored in the one or more computer-readable storage devices, the plurality of calibration factors corresponding to a plurality of calibration measurements, the plurality of calibration measurements comprising measurements of a second signal representative of a known value of the parameter at a plurality of signal amplitudes in each of a plurality of calibration ranges.

2. The device of claim 1, further including a user interface control which controls the at least one gain adjustment circuit to adjust the gain factor prior to sensing the first signal representative of the sensed parameter.

3. The device of claim 1, further including a gain adjustment routine which controls the at least one gain adjustment circuit, the gain adjustment routine adjusting the gain factor in response to sensing the first signal representative of the sensed parameter.

4. The device of claim 1, wherein the second signal representative of a known value is representative of one of a known voltage and a known current and wherein the plurality of calibration ranges includes 69 V, 120 V, 220 V, and 480 V for second signals representative of a known voltage, and 250 mA, 500 mA, 1 A, and 5 A for second signals representative of a known current.

5. The device of claim 1, further including a processor that determines at least one additional calibration factor using interpolation of the results of the plurality of calibration measurements.

6. The device of claim 1, further including a processor that uses interpolation to determine a calibrated measurement of a measured data point, the measured data point having a value between two calibration points.

7. The device of claim 1, wherein the plurality of calibration measurements further comprises measurements of the second signal representative of the known value of the parameter at a plurality of known signal frequencies.

8. The device of claim 7, wherein the plurality of known signal frequencies includes 50 Hz and 60 Hz.

9. A method for determining at least one parameter of an AC electrical service using a digital electrical power and energy meter, the method comprising:
sensing a plurality of first signals, each of the plurality of first signals comprising a supply voltage or a supply current of the AC electrical service;
generating a signal representative of each of the plurality of first signals;
communicating each of the plurality of first signals across each of a plurality of gain-adjustable channels, each channel having at least one individually-adjustable gain factor, wherein the plurality of gain-adjustable channels include a first channel for energy calculations, a second channel for harmonics calculations, and a third channel for waveform capture;
retrieving, from one or more computer-readable storage devices, one or more calibration factors corresponding to one or more of a plurality of calibration measurements, the plurality of calibration measurements comprising measurements of a second signal representative of a known voltage or a signal representative of a known current at a plurality of signal amplitudes in each of a plurality of calibration ranges; and
applying a one of the one or more calibration factors to each of the plurality of first signals to generate a measured value of the first signal, the measured value of the first signal equal to determine an actual value of the parameter.

10. The method of claim 9, wherein retrieving the one or more calibration factors further comprises selecting one or more of the individually-adjustable gain factors prior to sensing the plurality of first signals.

11. The method of claim 9, wherein retrieving the one or more calibration factors further comprises selecting one or more of the individually-adjustable gain factors in response to sensing the plurality of signals.

12. The method of claim 9, wherein the plurality of signal amplitudes includes 69 V, 120 V, 220 V, and 480 V for signals representative of a known voltage, and 250 mA, 500 mA, 1 A, and 5 A for signals representative of a known current.

13. The method of claim 9, further comprising determining at least one additional calibration factor using interpolation of the results of the stored calibration factors.

14. The meter of claim 9, further comprising using interpolation to determine a calibrated measurement of a measured data point, the measured data point having a value between two previously-determined calibration points.

15. The method of claim 9, wherein the plurality of calibration measurements further comprises measurements of the signal representative of the known current or the signal representative of the known voltage at a plurality of known signal frequencies.

16. The method of claim 13, wherein the plurality of known signal frequencies includes 50 Hz and 60 Hz.

17. A method for calibrating a digital power and energy meter, the method comprising:
providing a plurality of signals in each of a plurality of calibration ranges, each of the plurality of signals comprising one of a known voltage signal or a known current signal;
taking a measurement, at each of a plurality of signal amplitudes, of each of the plurality of signals using the digital power and energy meter;
comparing, for each measurement, the measured value of the known voltage signal or the known current signal to the actual value of the known voltage signal or the known current signal;
determining, for each measurement, a corresponding calibration factor; and
storing the plurality of calibration factors in a computer-readable storage device, to allow the digital power and energy meter to apply a corresponding one of the plurality of calibration factors in response to a measurement of an unknown voltage signal or an unknown current signal to determine the value of the unknown voltage signal or the unknown current signal with at least a pre-determined level of accuracy; and
providing a plurality of gain-adjustable channels, each channel having at least one individually-adjustable gain factor and comprising a plurality of signals representative of a sensed voltage or current, wherein the plurality of gain-adjustable channels include a first channel for energy calculations, a second channel for harmonics calculations, and a third channel for waveform capture.

18. The method of claim 17, wherein the plurality of calibration ranges includes 69 V, 120 V, 220 V, and 480 V for signals representative of a known voltage, and 250 mA, 500 mA, 1 A, and 5 A for signals representative of a known current.

19. The method of claim 17, further comprising determining at least one additional calibration factor using interpolation of the stored calibration factors.

20. The method of claim 17, further comprising using interpolation to determine a calibrated measurement of a measured data point, the measured data point having a value between two calibration points.

21. The method of claim 17, further comprising measuring each of the plurality of signal amplitudes at a plurality of signal frequencies.

22. The method of claim 21, wherein the plurality of signal frequencies includes 50 Hz and 60 Hz.

* * * * *

UNITED STATES PATENT AND TRADEMARK OFFICE
CERTIFICATE OF CORRECTION

| | | |
|---|---|---|
| PATENT NO. | : 7,996,171 B2 | Page 1 of 1 |
| APPLICATION NO. | : 12/055448 | |
| DATED | : August 9, 2011 | |
| INVENTOR(S) | : Banhegyesi | |

It is certified that error appears in the above-identified patent and that said Letters Patent is hereby corrected as shown below:

On the Title Pg. Item (60) should read,

(60) Provisional application No. 60/920,198, filed on Mar. 27, 2007

Signed and Sealed this
Twenty-second Day of November, 2011

David J. Kappos
*Director of the United States Patent and Trademark Office*